United States Patent
Frost et al.

(10) Patent No.: US 8,760,163 B2
(45) Date of Patent: Jun. 24, 2014

(54) DIFFUSION-WEIGHTED MAGNETIC RESONANCE IMAGING USING 3D MOSAIC SEGMENTATION AND 3D NAVIGATOR PHASE CORRECTION

(75) Inventors: Robert Frost, Colwyn Bay (GB); Peter Jezzard, Oxford (GB); Karla Miller, Oxford (GB); David Andrew Porter, Poxdorf (DE)

(73) Assignees: Isis Innovation Limited, Oxford (GB); Siemens Aktiengesellschaft, Munich (DE)

( * ) Notice: Subject to any disclaimer, the term of this patent is extended or adjusted under 35 U.S.C. 154(b) by 417 days.

(21) Appl. No.: 13/104,194

(22) Filed: May 10, 2011

(65) Prior Publication Data

US 2012/0286777 A1    Nov. 15, 2012

(51) Int. Cl.
*G01V 3/00* (2006.01)

(52) U.S. Cl.
USPC .......................................... 324/318; 324/309

(58) Field of Classification Search
USPC .......................... 324/300–322; 600/407–445
See application file for complete search history.

(56) References Cited

U.S. PATENT DOCUMENTS

| | | | |
|---|---|---|---|
| 6,853,191 B1 | 2/2005 | Miller et al. | |
| 7,205,763 B2 | 4/2007 | Porter | |
| 7,417,427 B2 | 8/2008 | Porter | |
| 2010/0235285 A1* | 9/2010 | Hoffberg | 705/75 |
| 2013/0088228 A1* | 4/2013 | Feiweier et al. | 324/309 |

OTHER PUBLICATIONS

Liu et al. Self-navigated interleaved spiral (SNAILS): Application to high-resolution diffusion tensor imaging; Magnetic Resonance in Medicine, vol. 62 (2004), pp. 1388-1396.
Porter et al. Multi-shot diffusion-weighted EPI with readout mosaic segmentation and 2D navigator correction; Proceedings, ISMRM, 12th Annual Meeting, Kyoto, Japan 2004, p. 442.
Anderson et al., Analysis and correction of motion artifacts in diffusion weighted imaging; Magnetic Resonance Medicine; vol. 32 ( 1994), pp. 379-387.
von Mengershausen et al., 3D diffusion tensor imaging with 2D navigated turbo spin echo; MAGMA, Magnetic Resonance Materials in Physics, Biology and Medicine, vol. 18, 2005, pp. 206-216; vol. 50 (2005).
Miller et al., Nonlinear phase correction for navigated diffusion imaging. In: Magn. Reson. Med. 2003;50: pp. 343-353.
Pipe et al: "Multishot Diffusion-Weighted FSE Using Propeller MRI"; Magnetic Resonance in Medicine 47: (2002); pp. 42-52.
Numano et al: "Diffusion-weighted three-dimensional MP-RAGE MR imaging", Magn. Reson. Med. Apr. 2005; 23 (3), pp. 463-468.

(Continued)

*Primary Examiner* — Brij Shrivastav
(74) *Attorney, Agent, or Firm* — Schiff Hardin LLP

(57) ABSTRACT

In a magnetic resonance apparatus and operating method therefore, 3D navigator data are acquired and are used to correct spatially varying phase errors in contemporaneously acquired imaging data in each shot of a multi-shot data acquisition sequence. A mosaic sampling scheme is used to enter the diffusion-weighted magnetic resonance data and the navigator data into k-space respectively in blocks that each form a subset of the entirety of k-space. The navigator data in each shot are entered into a block that is located at the center of k-space, and, in each shot, the corresponding image data are entered into an offset block in k-space, that is offset in at least one spatial direction from the navigator data block. The offset is varied from shot-to-shot.

4 Claims, 4 Drawing Sheets

Regions of K-space sampled using mosaic segmentation in 3D

(56) References Cited

OTHER PUBLICATIONS

Noll et al: "Homodyne detection in magnetic resonance imaging", IEEE Trans Med Imaging. 10(2), 1991,pp. 154-163.

Porter "2D-NAvigator Based Re-Acquisition for Motion Artefact Suppression in Multi-Shot, Diffusion Weighted Imaging", In: Proceedings of the 14th Annual Meeting of ISMRM, Seattle, USA, 2006, abstract 1047.

Nunes et al: "Self-navigated multishot echo-planar pulse sequence for high-resolution diffusion-weighted imaging", Magn. Reson. Med. vol. 53, (2005) pp. 1474-1478.

Wang at al. "Propeller EPI: an MRI technique suitable for diffusion tensor imaging at high field strength with reduced geometric distortions" Magn. Reson. Med vol. 54, (2006) pp. 1232-1240.

Atkinson et al: "Nonlinear phase correction of navigated multi-coil diffusion images", Magn. Resn. Med 2006; vol. 56, (2006) pp. 1135-1139.

Porter et al: "High Resolution Diffusion Weighted Imaging Using Readout-Segmented Echo-Planar Imaging, Parallel Imaging and a Two-Dimensional Navigator Based Re-Acquisition", Magn. Reson. Med. vol. 62, (2009) pp. 468-475.

Ordidge et al: "Correction of motiional artifacts in diffusion-weighted MR images using navigator echoes", Magn. Reson. Imag. vol. 12, (11994) pp. 455-460.

Jeong et al. High resolution DTI of a localized volume using 3D single-shot diffusion-weighted stimulated echo-planar imaging (3D ssDWSTEPI) Magn. Reson. Med. vol. 56, (2006) pp. 1173-1181.

McNab Ja et al: "3D steady-state diffusion-weighted imaging with trajectory using radially batched internal navigator echoes (Turbine)", Magn. Reson. Med. vol. 63 (1), (2010) pp. 235-242.

Mansfield et al: Volumar imaging using NMR spin echoes: echo-volumar imaging (EVI) at 0.1 T; J. Phys. E. 1989, vol. 22, (1989) pp. 234-330.

Mansfield et al: "Echo-volumar maging", MAGMA vol. 2 (1994), pp. 291-294.

Griswold et al: Generalized autocalibrating partially parallel acquisitions (GRAPPA); Magn. Reson. Med. 2002; vol. 47, (2002) pp. 1202-1210.

Frost et al. "Homodyne Reconstruction of Partial Fourier Readout-Segmented EPI for Diffusion Imaging" in Proceedings of the 18th Annual Meeting of ISMRM, Stockholm, Sweden, (abstract 1625) (2010).

\* cited by examiner

Regions of K-space sampled using mosaic segmentation in 3D

DIFFUSION-WEIGHTED MAGNETIC RESONANCE IMAGING USING 3D MOSAIC SEGMENTATION AND 3D NAVIGATOR PHASE CORRECTION

BACKGROUND OF THE INVENTION

1. Field of the Invention

The present invention relates to diffusion-weighted magnetic resonance imaging, and in particular to a method and magnetic resonance apparatus wherein phase errors in the diffusion-weighted magnetic resonance data are corrected.

2. Description of the Prior Art

Multi-shot, diffusion-weighted imaging (DWI) of the brain is sensitive to spatially dependent, non-linear phase errors that are caused by the effect of CSF pulsation and cardiac-related pulsatile motion on the brain during the diffusion-encoding gradients. The phase images in FIG. 1 shows how these phase errors vary substantially from one shot to the next, as illustrated for exemplary shots S1, S2, S3, S4 and S5. This leads to severe image artefacts in the final image if no correction is applied.

For 2D acquisitions, in which each image plane is excited by a separate slice-selective radiofrequency (RF) pulse, a number of techniques have been demonstrated that allow the correction of these 2D non-linear, phase errors. These methods use signals from a '2D navigator', which maps the spatial phase variation in two dimensions within the plane of the excited slice, and use this information to correct the associated imaging data. These 2D methods are extensions of the original concept of navigator correction, which was a 1D technique that corrected for a linear phase variation along the readout direction.

In a number of applications of DWI it would be beneficial to be able to perform a diffusion-encoded 3D image acquisition. This would make it feasible to acquire data sets with an isotropic resolution that would offer an improved visualisation of small lesions and allow easy comparison with 3D anatomical data sets, acquired with SPACE (Sampling Perfect with Application optimized Contrast using different flip angle Evaluations) or MPRAGE (Magnetization Prepared Rapid Gradient Echo Imaging) sequence types. These 3D data sets would allow interactive and automatic post-processing procedures, such as volume rendering or the reconstruction of 2D slices with arbitrary orientation. 3D diffusion-weighted data would also be valuable for tractography studies in diffusion tensor imaging (DTI).

However, when performing 3D data acquisition, the entire imaging volume is excited at each shot and not just a single imaging slice as in the 2D case. This means that it is now necessary to apply a correction for the spatial phase variation in all three dimensions, which is not possible using the existing acquisition and navigator correction schemes used in 2D multi-shot imaging. There is thus a need for a 3D acquisition scheme for imaging and navigator data that is suitable for performing a true 3D phase correction.

A number of sequences have been proposed for performing 3D DWI.

One approach is to add a diffusion preparation module before each train of low-flip-angle excitations in the 3D MPRAGE sequence, as described in (Numano T, Homma K, Hirose T. Diffusion-weighted three-dimensional MP-RAGE MR imaging. Magn Reson Imaging. 2005 April; 23(3):463-8). As there is no navigator phase correction applied in this sequence, it is susceptible to phase variations from one echo-train to the next. This method appears to have only been used in anaesthetized animal studies.

Another method, which has been used in human studies, is a single-shot 3D acquisition from a restricted volume (Jeong E-K, Kim S-E, Kholmovski E G, Parker D L. High resolution DTI of a localized volume using 3D single-shot diffusion-weighted stimulated echo-planar imaging (3D ssDWSTEPI). Magn. Reson. Med. 2006; 56:1173-1181.) The sequence uses a single diffusion preparation for each volume acquisition, so there are no problems with shot-to-shot phase variation. The signal in a selected volume is spatially encoded using a stimulated echo approach with a series of small flip angles to create a train of stimulated echoes, each of which is sampled with an EPI readout to provide encoding in two (in-plane) dimensions. Spatial encoding in the third dimension is produced by applying a different slice-direction, phase-encoding gradient for each individual stimulated echo signal. To avoid distortion and blurring problems, associated with the single-shot readout, application of the sequence is restricted to small volumes of interest. Also the combination of the stimulated echo acquisition and the low flip-angle detection pulses is likely to result in a relatively low signal-to-noise ratio (SNR).

One approach to navigator-correction in 3D DWI has been proposed in the TURBINE method (McNab J A, Gallichan D, Miller K L. 3D steady-state diffusion-weighted imaging with trajectory using radially batched internal navigator echoes (TURBINE). Magn Reson Med. 2010 January; 63(1):235-42.0). This technique uses a diffusion-weighted, steady-state free-precession signal, which is formed when a monopolar, diffusion-encoding gradient is applied after each RF excitation pulse in a train of low-flip-angle pulses with short TR. Each RF pulse excites magnetisation from the entire measurement volume and an EPI readout is used to spatially encode the signals in two dimensions. To provide spatial encoding in three dimensions the plane of EPI spatial encoding is rotated about one of its central axes from one excitation to the next. Because each EPI readout samples a plane which passes through the centre of k-space, 2D phase correction data are available directly from the imaging data and no separate navigator signal is required. However, there is no information about phase variation perpendicular to the plane of the EPI encoding. This is addressed by acquiring an ECG signal during the measurement and combining data from different RF excitations, but which were acquired at similar points in the cardiac cycle. In this way, a multi-shot 3D navigator signal is generated for a given point in the cardiac cycle. In addition, data acquired during early systole, when pulsatile effects are most significant, were rejected and not used during image reconstruction.

The idea of using 2D data to correct phase errors in a 3D diffusion-weighted acquisition has also been described in relation to a turbo-spin-echo (TSE) sequence in (von Mengershausen M, Norris D G, Driesel W. 3D diffusion tensor imaging with 2D navigated turbo spin echo. MAGMA. 2005; 18(4)).

A 2D navigator-corrected, readout-segmented EPI (rs-EPI) technique described in U.S. Pat. No. 7,205,763, and is briefly reviewed as follows before describing the new method in the following section.

As shown in FIG. 2, at each shot, two spin echoes are sampled using an EPI readout with a limited coverage in the $k_x$ direction and full coverage in the $k_y$ direction. For the imaging echo, a variable dephase gradient $G_R$ is applied along the readout direction to provide a k-space offset along $k_x$, so that a 'segment' of k-space is acquired for a subset of the $k_x$ points required for the image. For the navigator echo a fixed dephase gradient $G_R$ is applied, so that the readout segment in this case is always located at the centre of k-space. During image reconstruction, the navigator data are used to perform an image-domain phase correction on the corresponding readout segment sampled by the imaging echo. Critically, both imaging and navigator acquisitions sample contiguous regions of k-space, so that the Nyquist sampling condition is fulfilled in both $k_x$ and $k_y$ directions. This allows navigator phase correction to be applied without the complications of aliased signal contributions.

The reduced $k_x$ coverage allows a much shorter spacing between the echoes in the EPI readout than single-shot EPI, thereby reducing susceptibility artefacts. The corresponding reduction in EPI echo-train length reduces blurring due to $T_2^*$ decay and allows high spatial resolutions that are not possible with single-shot EPI.

SUMMARY OF THE INVENTION

The method in accordance with the invention provides a way to acquire true 3D navigator data, which can be used to correct the spatially varying phase errors in the corresponding imaging data at each shot. To make this possible, a 'mosaic' sampling scheme is used that samples (at each shot) a contiguous set of k-space points in 3D k-space, which form a subset of the full range of k-space required. The navigator data are acquired from a fixed region at the center of k-space and the imaging data are acquired from a region of k-space that may be offset from the k-space centre along all three axes. At each shot the imaging data offsets are varied, so that the whole of k-space is sampled by the multi-shot acquisition. Because the data points are contiguous, the Nyquist sampling condition is now fulfilled in all three dimensions and 3D phase correction can be applied without problems from aliased signals.

The extent of the sampled region in each dimension would typically be less than that of the full range of k-space points required for the chosen image resolution. However, with some scanning protocols it might be possible to sample the complete set of k-space points along one or two of the k-space axes at each shot. In some cases, this approach might reduce image artefacts or allow faster scan times.

DESCRIPTION OF THE PREFERRED EMBODIMENTS

Figure 5:
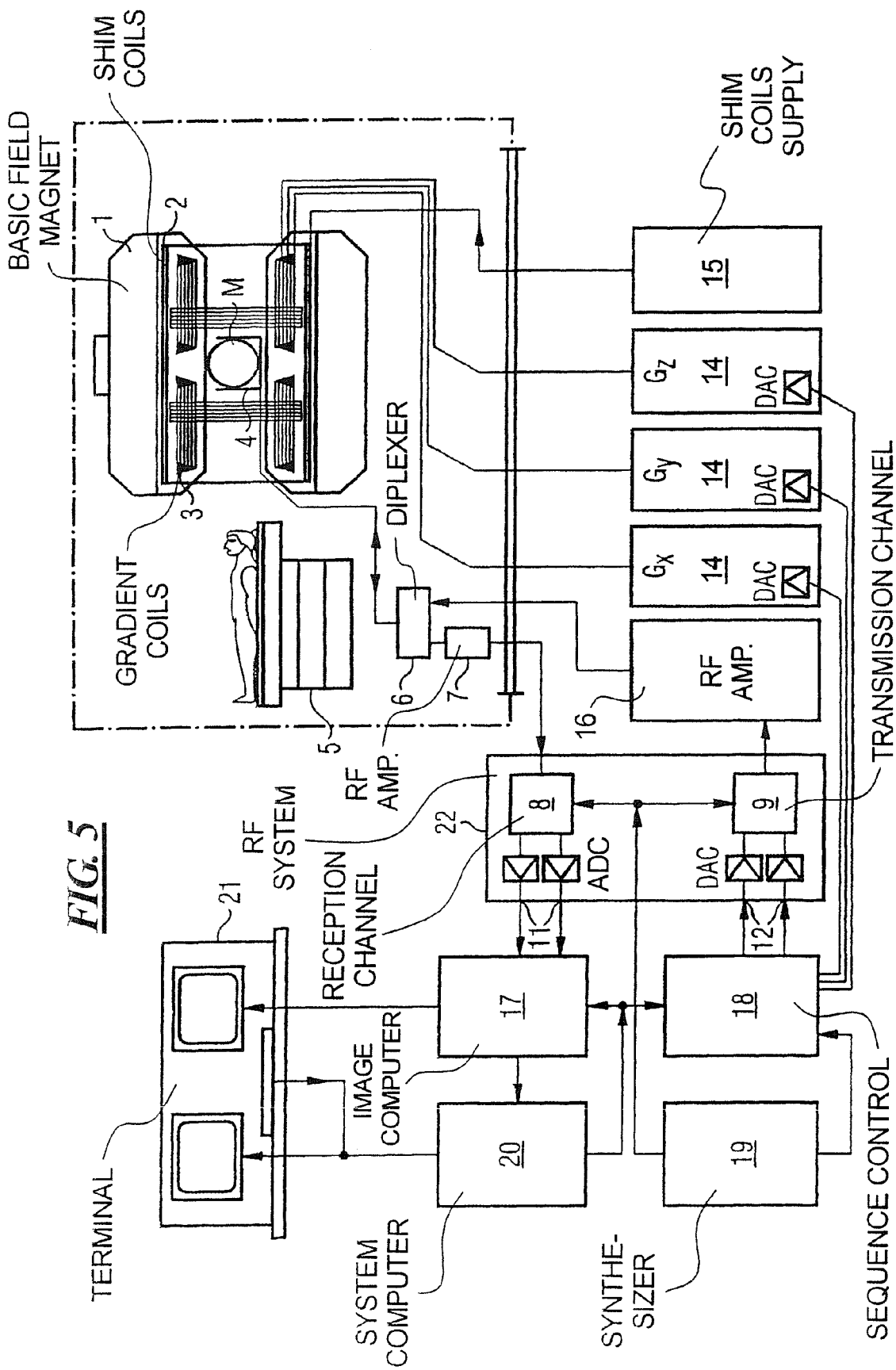
FIG. 5 is a schematic block diagram illustrating the basic components of a magnetic resonance imaging system constructed and operating in accordance with the present invention.

FIG. 5 schematically illustrates a magnetic resonance tomography apparatus in which gradient pulses according to the present invention are generated. The design of the magnetic resonance tomography apparatus corresponds a conventional tomography apparatus, with the exceptions discussed below. A basic field magnet 1 generates a temporally constant strong magnetic field for polarization or alignment of the nuclear spins in the examination region of the subject such as, for example, a part of a human body to be examined. The high homogeneity of the basic magnetic field necessary for the magnetic resonance data acquisition is defined in a spherical measurement volume M in which the parts of the human body to be examined are introduced. For support of the homogeneity requirements, and in particular for elimination of temporally invariable influences, shim plates made from ferromagnetic material are mounted at a suitable location. Temporally variable influences are eliminated by shim coils 2 that are activated by a shim current supply 15.

A cylindrical gradient coil system 3 that is composed of three coils (windings) is used in the basic field magnet 1. Each coil is supplied with current by an amplifier 14 for generation of a linear gradient field in the respective direction of the Cartesian coordinate system. The first coil of the gradient field system 3 generates a gradient $G_x$ in the x-direction, the second coil generates a gradient $G_y$ in the y-direction and the third coil generates a gradient $G_z$ in the z-direction. Each amplifier 14 has a digital-analog converter that is activated by a sequence controller 18 for time-accurate generation of the gradient pulses.

Located within the gradient field system 3 is a radio-frequency antenna 4 that converts the radio-frequency pulses emitted by a radio-frequency power amplifier 16 into a magnetic alternating field for excitation of the nuclei and alignment of the nuclear spins of the subject to be examined, or of the region of the subject to be examined. The alternating field originating from the precessing nuclear spins (i.e. normally the nuclear spin echo signals caused by a pulse sequence composed of one or more radio-frequency pulses and one or more gradient pulses) is also converted by the radio-frequency antenna 4 into a voltage that is supplied via an amplifier 7 to a radio-frequency receiver channel 8 of a radio-frequency system 22. The radio-frequency system 22 furthermore has a transmission channel 9 in which are generated the radio frequency pulses for the excitation the nuclear spins. The respective radio-frequency pulses are digitally represented as a series of complex numbers conforming to a pulse sequence predetermined in the sequence controller 18 by the system computer 20. This number series is supplied as a real part and an imaginary part via respective inputs 12 to a digital-analog converter (DAC) in the radio-frequency system 22 and, from this, to a transmission channel 9. In the transmission channel 9, the pulse sequences are modulated with a radio-frequency carrier signal whose base frequency corresponds to the resonance frequency of the nuclear spins in the measurement volume.

Switchover from transmission mode to reception mode ensues with a transmission-reception diplexer 6. The radio-frequency antenna 4 radiates the radio-frequency pulses into the measurement volume M for excitation of the nuclear spins and samples resulting echo signals. The acquired nuclear magnetic resonance signals are phase-sensitively demodulated in the reception channel 8 of the radio-frequency system 22 and converted into a real part and an imaginary part of the measurement signal in a respective analog-digital converter. An image is reconstructed by an image computer 17 from the measurement data so acquired. The administration of the measurement data, the image data and the control programs ensues via a system computer 20. Based on control programs, the sequence controller 18 monitors the generation of the respectively desired pulse sequences and the corresponding sampling of k-space. The sequence controller 18 controls the time-accurate switching of the gradients, the emission of the radio-frequency pulses with defined phase and amplitude and the receipt of the magnetic resonance signals. The time base for the radio-frequency system 22 and the sequence controller 18 is provided by a synthesizer 19. The selection of corresponding control programs for generation of a nuclear magnetic resonance image as well as the representation of the generated magnetic resonance image ensues via a terminal 21 that has a keyboard as well as one or more screens.

Figure 1:
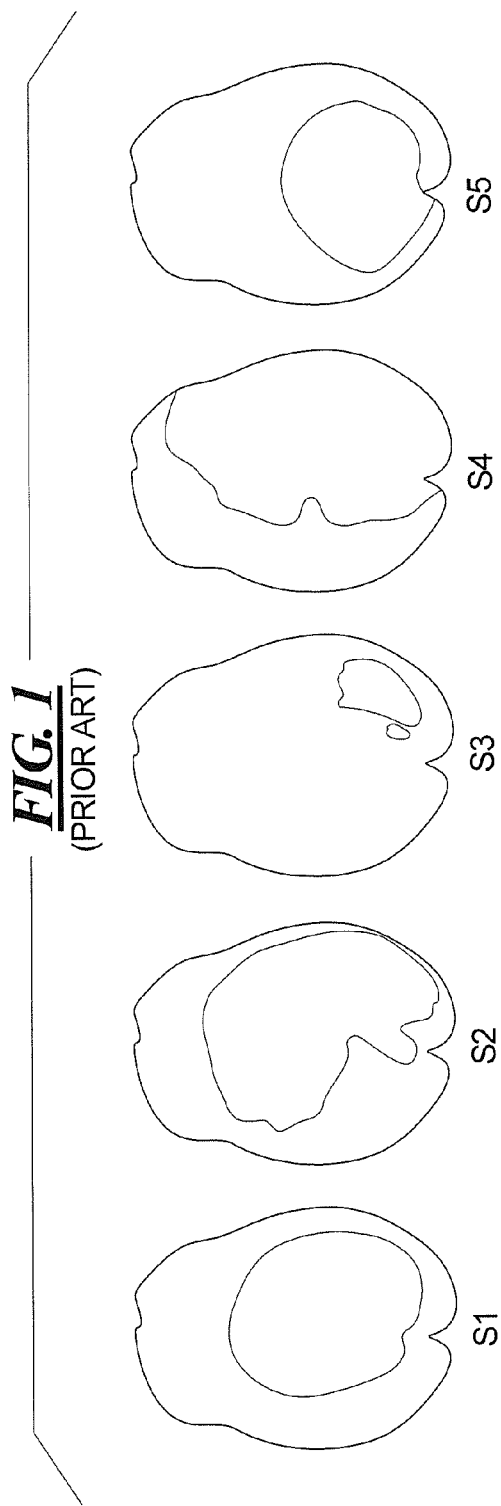
FIG. 1, as noted above, illustrates navigator images obtained with a 2D multi-shot, DWI sequence, showing a non-linear, spatial phase variation from shot-to-shot.
Figure 3:
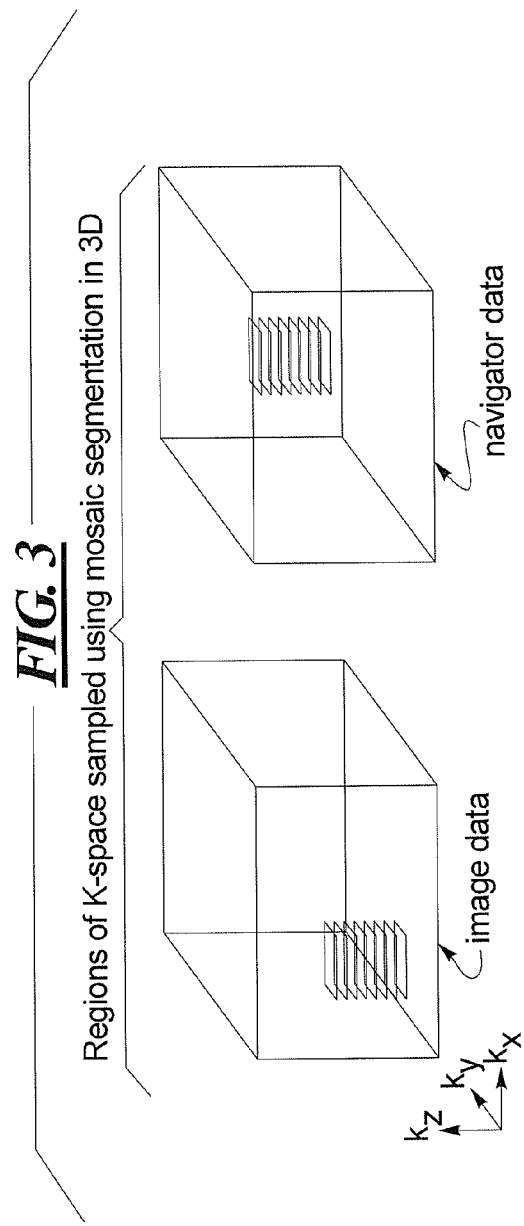
FIG. 3 schematically illustrates k-space regions sampled for imaging and navigator data using 3D mosaic segmentation in accordance with the present invention.

FIG. 3 schematically illustrates k-space regions that are sampled for imaging and navigator data using 3D mosaic segmentation, by operating the system shown in FIG. 5 in accordance with the present invention. Each region is composed of a set of $k_z$ planes, which form a block of contiguous k-space points.

Figure 4:
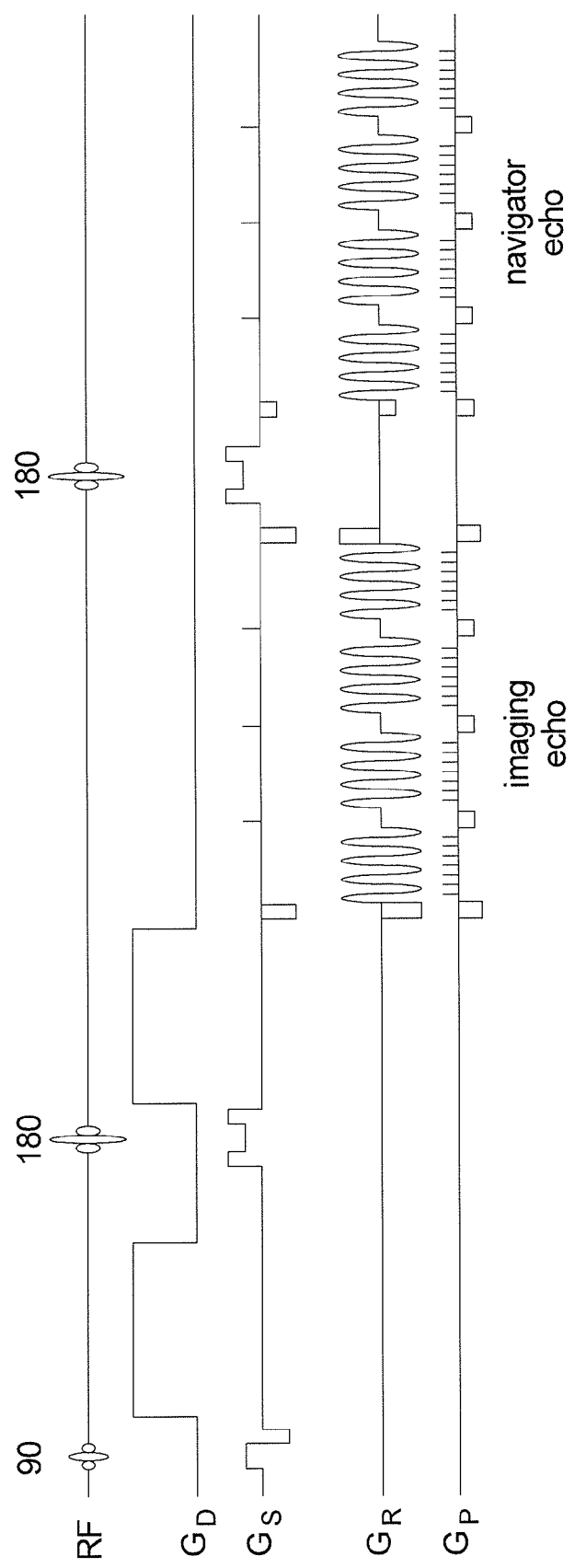
FIG. 4 illustrates a pulse sequence suitable for sampling 3D k-space in the manner shown on FIG. 3, in accordance with the present invention.

FIG. 4 shows a pulse sequence that can be used in accordance with the invention to sample 3D k-space in the way shown in FIG. 3. Such a pulse sequence can be generated by the sequence controller 18 or the system computer 20 in FIG. 5. The sequence is based on the single-shot, echo-volumar imaging technique (EVI) (Mansfield P, Howseman A M, Ordidge R J. Volumar imaging using NMR spin echoes: echo-volumar imaging (EVI) at 0.1 T. J. Phys. E. 1989; 22: 234; Mansfield P, Harvey P R, Stehling M K. Echo-volumar imaging. MAGMA 1994; 2:291-294), in which spatial encoding can be applied in all three directions during a single readout. As with rs-EPI, a rapidly switched readout gradient is used to sample a subset of $k_x$ points and pre-phase gradients are used to provide a variable $k_x$ offset for the imaging echo and a fixed $k_x$ offset for the navigator echo.

Figure 2:
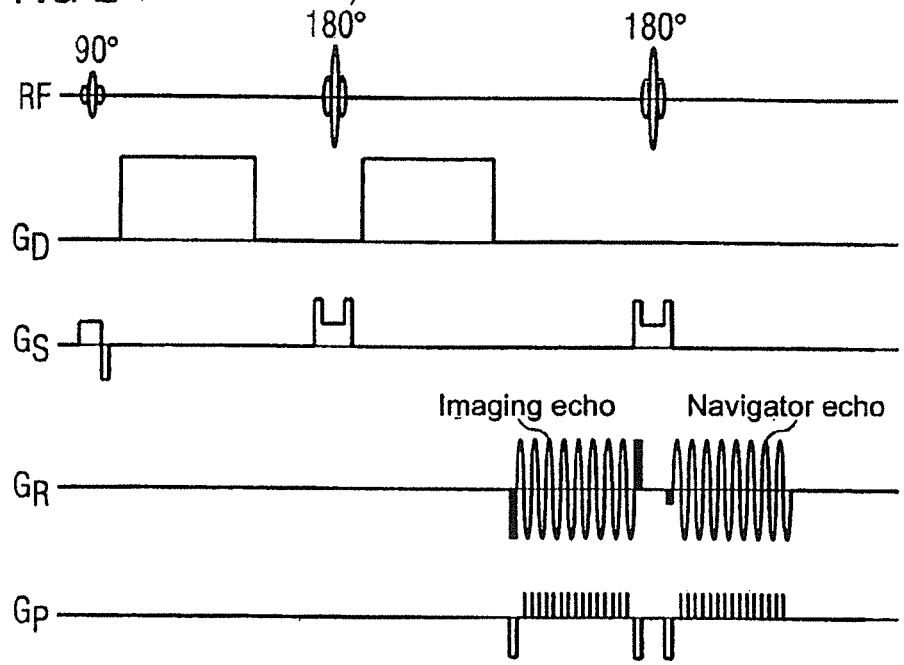
FIG. 2, as noted above, illustrates a known pulse sequence and k-space diagram for 2D navigator-corrected, rs-EPI.
Figure 2:
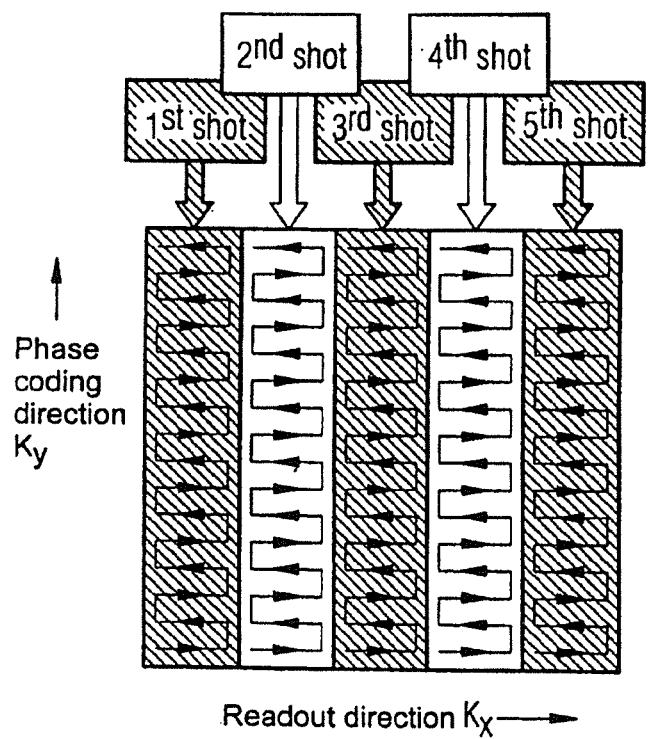

For spatial encoding along the y direction a blipped phase-encoding gradient is used, but in contrast to the 2D rs-EPI sequence (FIG. 2), only a subset of $k_y$ points are sampled. Pre-phase gradients are used to provide a variable $k_y$ offset at the start of the imaging echo and a fixed $k_y$ offset at the start of the navigator echo. This $k_y$ spatial-encoding module is repeated a number of times during both imaging and navigator readouts. After each application, a further gradient is applied along the y direction to return to the initial $k_y$ offset and a blipped gradient is applied along the slice-encoding (z) direction to navigate to the next $k_z$ plane. Pre-phase gradients are used along z to apply variable and fixed $k_z$ offsets for imaging and navigator echoes respectively.

After data acquisition for each shot, 3D navigator phase correction can be applied in the image domain by first applying an inverse 3D Fourier transform to transform both imaging and navigator data to image (or real) space. The complex imaging data I(x,y,z) are then multiplied on a pixel-by-pixel basis by a version of the complex navigator data N(x,y,z), in which all pixel magnitudes have been normalized to one, so that a set of corrected complex pixel values $I_{cor}$ are generated:

$$I_{cor}(x, y, z) = \frac{I(x, y, z) \cdot N(x, y, z)}{|N(x, y, z)|}.$$

it should be noted that the presence of the 180° refocusing pulse between imaging and navigator data means that it is not necessary to use the complex conjugate of the navigator data when applying the correction.

After the correction has been performed, a forward 3D Fourier transform is used to convert the corrected imaging data $I_{cor}$(x,y,z) back to k-space, where data from the different shots are stored at the appropriate k-space co-ordinates in a 3D array of complex data points. When all required data points have been corrected and stored, the final 3D image data set is generated by applying a 3D inverse Fourier transform to the entire stored data set.

As previously described in 2D navigator-corrected rs-EPI, artefacts due to mismatch at the interfaces between readout segments can be minimized by acquiring additional 'overlapping' data points at the edges of the readout segments. Similarly, it might be advantageous with 3D mosaic segmentation to acquire additional data points at the edge of the sampled k-space region in all three dimensions. In this case, the additional data points would be used during navigator phase correction and then discarded when storing the corrected data.

An alternative approach to navigator phase correction that has been described previously for 2D navigators (Miller K L, Pauly J P. Nonlinear phase correction for navigated diffusion imaging. Magn. Reson. Med. 2003; 50:343-353; Miller K, Pauly J M. Method of removing dynamic nonlinear phase errors from MRI data. U.S. Pat. No. 6,853,191 B1 (2005)) is to apply the correction as a direct deconvolution in k-space. This avoids the requirement to transform the data into the image domain in order to apply the correction and was found to substantially reduce processing time in the 2D case. Extending this idea to a 3D deconvolution for data acquired using the 3D mosaic segmented sequence is likely to offer significant increases in the speed of 3D navigator correction and overall image reconstruction.

The relatively slow spatial encoding along the z direction makes this direction the most sensitive to spatial distortion and susceptibility artefacts. To minimize this problem, a parallel imaging technique (such as GRAPPA) could be used along both $k_y$ and $k_z$ directions to reduce the number of k-space points that are sampled, thereby also reducing the time between the acquisition of the $k_z$ planes. Both imaging and navigator data sets would typically be unsersampled in the same way and GRAPPA would then be used to reconstruct the data in both cases.

To reduce the overall scan time, some data on one side of 3D k-space could be omitted and the data reconstructed using a partial Fourier method. This approach has previously been shown to be an effective way to reduce the number of shots in 2D rs-EPI.

Another technique that has been found to improve image quality in 2D rs-EPI is to use a re-acquisition scheme to replace measured data when there are extreme phase errors that cannot be removed by the navigator phase correction procedure. In this method, such corrupt data sets are identified by a large signal distribution width in k-space, corresponding to a high level of high-spatial-frequency phase error. A similar re-acquisition procedure could also be used with the new mosaic-segmented 3D sequence. In this case, it would be necessary to consider the signal distribution width along all three k-space axes.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for generating phase-corrected diffusion-weighted magnetic resonance data, comprising the steps of:
    operating a magnetic resonance data acquisition unit with a multi-shot, diffusion-weighted pulse sequence, comprising excitation of nuclear spins, diffusion preparation, and data readout, to acquire diffusion-weighted magnetic resonance data and navigator data, said diffusion-weighted magnetic resonance data exhibiting phase errors;
    entering said diffusion-weighted magnetic resonance data and said navigator data into an electronic memory at 3D locations respectively representing points in k-space having a k-space center, by entering, for each shot in said multi-shot diffusion-weighted pulse sequence, navigator data into a fixed 3D block at said k-space center and entering said diffusion-weighted magnetic resonance data into an offset 3D block in k-space that is different in at least one spatial direction from said fixed 3D block, each of said fixed 3D block and said offset 3D block being a subset of an entirety of k-space, and varying said offset of said offset 3D block from shot-to-shot until said entirety of k-space is filled by said diffusion-weighted magnetic resonance data; and in a computerized processor having access to said memory, correcting said phase errors in said diffusion-weighted magnetic resonance data entered in k-space using said navigator data entered in k-space, and thereby generating phase-corrected, diffusion-weighted magnetic resonance data, and making said phase-corrected diffusion-weighted magnetic resonance data available for further processing as an electronic data file.

2. A method as claimed in claim 1 wherein said excitation of nuclear spins comprises radiating a slice-selective 90 degree RF pulse.

3. A magnetic resonance system for generating phase-corrected diffusion-weighted magnetic resonance data, comprising:

a magnetic resonance data acquisition unit;

a computerized control unit configured to operate said magnetic resonance data acquisition unit with a multi-shot, diffusion-weighted pulse sequence, comprising excitation of nuclear spins, diffusion preparation, and data readout, to acquire diffusion-weighted magnetic resonance data and navigator data, said diffusion-weighted magnetic resonance data exhibiting phase errors;

an electronic memory in which said control unit enters said diffusion-weighted magnetic resonance data and said navigator data at 3D locations respectively representing points in k-space having a k-space center, by entering, for each shot in said multi-shot diffusion-weighted pulse sequence, navigator data into a fixed 3D block at said k-space center and entering said diffusion-weighted magnetic resonance data into an offset 3D block in k-space that is different in at least one spatial direction from said fixed 3D block, each of said fixed 3D block and said offset 3D block being a subset of an entirety of k-space, and varying said offset of said offset 3D block from shot-to-shot until said entirety of k-space is filled by said diffusion-weighted magnetic resonance data; and a computerized processor having access to said memory, configured to correct said phase errors in said diffusion-weighted magnetic resonance data entered in k-space using said navigator data entered in k-space, and thereby generating phase-corrected, diffusion-weighted magnetic resonance data, and to make said phase-corrected diffusion-weighted magnetic resonance data available for further processing as an electronic data file.

4. A non-transitory, computer-readable storage medium encoded with programming instructions, said storage medium being configured for loading into a computerized control end processing system of a magnetic resonance system, said magnetic resonance system comprising a magnetic resonance data acquisition unit and a memory, said programming instructions causing said computerized control and processing system to:

operate said magnetic resonance data acquisition unit with a multi-shot, diffusion-weighted pulse sequence to acquire diffusion-weighted magnetic resonance data and navigator data, said diffusion-weighted magnetic resonance data exhibiting phase errors;

enter said diffusion-weighted magnetic resonance data and said navigator data into an electronic memory at 3D locations respectively representing points in k-space having a k-space center, by entering, for each shot in said multi-shot diffusion-weighted pulse sequence, navigator data into a fixed 3D block at said k-space center and entering said diffusion-weighted magnetic resonance data into an offset 3D block in k-space that is different in at least one spatial direction from said fixed 3D block, each of said fixed 3D block and said offset 3D block being a subset of an entirety of k-space, and varying said offset of said offset 3D block from shot-to-shot until said entirety of k-space is filled by said diffusion-weighted magnetic resonance data; and correct said phase errors in said diffusion-weighted magnetic resonance data entered in k-space using said navigator data entered in k-space, and thereby generating phase-corrected, diffusion-weighted magnetic resonance data, and making said phase-corrected diffusion-weighted magnetic resonance data available for further processing as an electronic data file.

\* \* \* \* \*